United States Patent [19]

Van Essen et al.

[11] 3,997,773
[45] Dec. 14, 1976

[54] INTERPOLATING DIGITAL FILTER WITH INPUT BUFFER

[75] Inventors: Hendrik Arie Van Essen; Nicolaas Alphonsus Maria Verhoeckx; Wilfred André Maria Snijders, all of Eindhoven, Netherlands

[73] Assignee: U.S. Philips Corporation, New York, N.Y.

[22] Filed: Aug. 25, 1975

[21] Appl. No.: 607,611

[30] Foreign Application Priority Data

Sept. 16, 1974 Netherlands .................... 7412225

[52] U.S. Cl. .............................. 235/156; 325/42; 328/167
[51] Int. Cl.² .................... G06F 7/38; G06F 15/34
[58] Field of Search ............ 235/156, 152; 325/42, 325/65; 328/162, 167; 333/18, 28, 70 T

[56] References Cited

UNITED STATES PATENTS

| 3,633,014 | 1/1972 | Lemp, Jr. et al. | 235/152 |
| 3,633,105 | 4/1972 | Lender et al. | 325/42 |
| 3,651,316 | 3/1972 | Gibson | 235/152 |
| 3,794,816 | 2/1974 | Esteban | 235/152 |
| 3,883,727 | 5/1975 | Stuart et al. | 235/152 |

Primary Examiner—Joseph F. Ruggiero
Attorney, Agent, or Firm—Frank R. Trifari; Daniel R. McGlynn

[57] ABSTRACT

A non-recursive interpolating digital filter for generating, output code works, at an arbitrary rational ratio between the input and output sampling frequencies. The input code words are entered and stored in a buffer, and entered into a storage device at predetermined times determined by a controlled pulse generator.

8 Claims, 3 Drawing Figures

INTERPOLATING DIGITAL FILTER WITH INPUT BUFFER

The invention relates to a non-recursive interpolating digital filter for generating output code words which occur at a certain output sampling frequency ($f_u$) and which are related in a predetermined way to a sequence of input code words, which occur at an input sampling frequency ($f_i$), the ratio between the output sampling frequency ($f_u$) and the input sampling frequency ($f_i$) being a factor M/L (M and L integers, M > L); comprising a storage device which is arranged to store successive input code words, a multiplier for forming products of the input codewords stored in the storage device and of weight factors which determine the relationship between the input and output code words, and an adder which is coupled to the said multiplier and which is arranged to supply the output code words which occur at the output sampling frequency ($f_u$) and which are given by the mathematical sum of the products formed by the multiplier within the output sampling period ($1/f_u$).

Non-recursive interpolating digital filters of the type described above are known, but to enable these known filters to be realized it is a condition that the ratio M/L between the output sampling frequency ($f_u$) and the input sampling frequency ($f_i$) is a whole number which limits the practical use.

The invention has for its object to provide a non-recursive interpolating digital filter in which the ratio between the output and input sampling frequencies may have any rational value, without making the structure of such a filter considerably more complicated.

For that purpose the filter according to the invention is characterized in that the storage device at its input includes a buffer device which is arranged for receiving input code words which occur with a period ($1/f_i$), for storing these code words for a variable time under the control of a control device and for supplying them to the said storage device at intervals which are an integral multiple of the output sampling period ($1/f_u$) apart.

In an article by R. W. Schafer and L. R. Rabiner, entitled: "A Digital Signal Processing Approach to Interpolation", published in: "Proceedings of the I.E.-.E.E.", volume 61, No. 6, June 1973, a method is proposed to realize a fractional ratio (M/L; M and L integers) between the output and input sampling frequencies by means of two digital filter sections. To this end the input sampling frequency ($f_i$) is increased by a factor (M) in a first digital filter section, whereafter in a second digital filter section a part, namely one out of each group of L output code words of the first digital filter section, is taken to decrease the output sampling frequency of said first digital filter section to the output sampling frequency ($f_u$).

Because the number of multiplications which must be performed in an interpolating filter to generate one output code word is N/M (N/M is whole), N/M. $Mf_i$ = $Nf_i$ multiplications per second must be performed in the first digital filter section, where N is the number of weight factors. Reducing the output sampling frequency of this first digital filter section does not affect the required speed of calculation.

The number of weight factors (N) determines the accuracy with which the filter function is performed, so that at a given desired accuracy the application of this method is limited to the filtering of signals whose sampling frequency ($f_i$) does not exceed a certain value due to the speeds which are still permissible in such a filter.

Using the measure according to the invention achieves that the N/M multiplications are performed in an output sampling period ($1/f_u$), so that the number of multiplications per second is reduced to $$\frac{N}{M} \cdot f_u = \frac{N}{L} \cdot f_i.$$

At a given accuracy of the filter function and a given maximum permissible speed in the digital filter the input sampling frequency ($f_i$) may be a factor (L) greater than when the method described in the above-mentioned article is used; also, with a given input sampling frequency and a given accuracy, the speed of computation may be decreased or with a given $f_i$ and given speed of computation the accuracy can be increased, so that the field of application of a non-recursive interpolating filter is considerably extended.

The invention will now be described with reference to the Figures.

Figure 1:
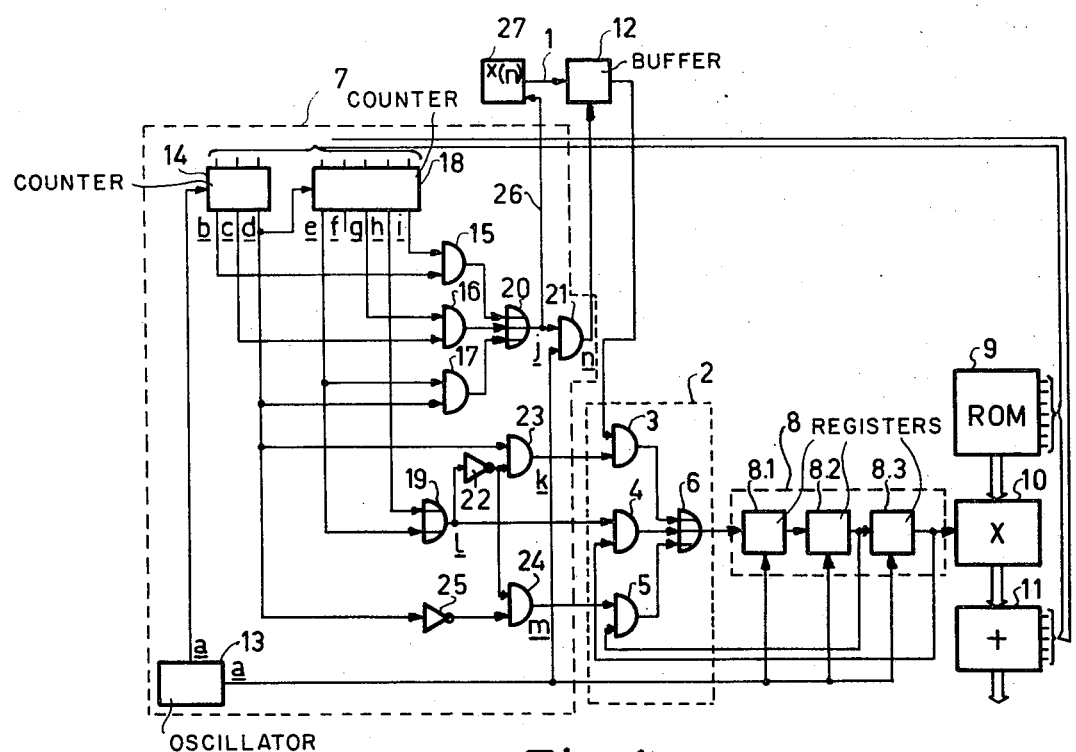
FIG. 1 shows a block diagram of a non-recursive, interpolating digital filter according to the invention.

In the embodiment shown in FIG. 1 the interpolating filter has an input 1 to which the input signal to be filtered is supplied. This input signal, designated in the Figure by $x(n)$, is formed by a sequence of input code words, for example binary-coded samples of an analogue information signal, the code words being applied at a frequency $f_i$ which was called the input sampling frequency herein before. These code words are supplied to a switching device 2 which is formed by three AND-gates 3, 4 and 5 and an OR-gate 6, the AND-gates 3, 4 and 5 also having supplied to them pulses delivered by the pulse generator 7.

If in switching device 2 the AND-gate 3 is opened by a pulse from the generator 7, an input code word $x(n)$ is written in a storage device 8, which in this embodiment is formed by a shift register having three register sections 8.1, 8.2 and 8.3, which are each capable of storing an entire input code word. In this shift register successive input code words are stored in successive register sections. Each time a new code word is written into this register, the code words already stored in it are shifted one position and the oldest code word in the register disappears from it. Represented in symbols, the register sections 8.1, 8.2 and 8.3 contain, after a new input code word has been entered, the code words $x(n)$, $x(n-1)$ and $x(n-2)$ respectively.

After a new input code word has been entered the AND-gate 3 is closed and, due to a pulse delivered by generator 7, either AND-gate 4 or AND-gate 5 is opened in which situations either the last or the last but one register section is connected to the first or input register secton 8.1, so that a circulating shift register is obtained.

When a new input code word has been entered, a cycle of calculations follows in which pulses from generator 7 are supplied to the register sections and to a circulating storage device 9, for example a ROM, where the weight factors, called "filter coefficients"

have been stored. Each of these pulses causes a filter coefficient and the corresponding code word which is stored in the last register section 8.3 to be supplied to inputs of a multiplier 10, which then forms the product of that code word and that filter coefficient and which supplies this product to an accumulator 11. After each of the input code words present in the register 8 have been multiplied once by a filter coefficient and after the products obtained in this manner have been added to one another in accumulator 11, i.e. at the end of a calculation cycle, this accumulator is reset to the zero position. However, each time prior to resetting of the accumulator, the code word then present in the accumulator is read. The frequency of this read-out action has already been called the output sampling frequency ($f_u$) herein before.

In order to cause all the output code words to be available at mutually equal time intervals $$1/f_u = \frac{L}{M} \cdot 1/f_i,$$

shift register 8 is constructed as a shift register with periodically changing storage time, as described in the copending U.S. application Ser. No. 607,630.

A new input code word $x(n)$ can only be entered into storage device 8 if the register section 8.1 contains the code word $x(n-1)$ and register section 8.2 contains the code word $x(n-2)$, which is the case at those instants that an output code word has been formed. When the ratio between the output and input sampling frequencies i.e. the factor M/L, is not a whole number it will not always be possible, at the instant at which a new input code word occurs, to write this code word into the storage device. Therefore, after input 1 a buffer device consisting of a buffer 12 and a read-out device in the form of AND-gate 3 is included which has a variable buffer time in such a way that a new input code word is presented to the storage device at instants which are a whole number of times of the output sampling frequency ($1/f_u$) apart.

In the embodiment shown in FIG. 1 the generator 7, which supplies the pulses for the control of the digital filter, includes an oscillator 13 which supplies output pulses at a frequency $$\frac{N}{L} f_i.$$

An output of the oscillator 13 is connected not only to the clock pulse inputs of the shift register sections 8.1, 8.2 and 8.3, but also to a binary divider or counter 14, which divides the output frequency of the oscillator by a factor of (N/M); in this embodiment $N = 15$, $M = 5$ and $L = 3$. The outputs of the divider 14 are connected to inputs of AND-gates 15, 16 and 17 while one output of divider 14 is also connected to the input of a divider or counter 18 which divides the output frequency of the divider 14 by a factor (M). Outputs of divider 18 also are connected to inputs of AND-gates 15, 16 and 17 and furthermore to inputs of an OR-gate 19. The outputs of AND-gates 15, 16 and 17 are connected to the inputs of an OR-gate 20, at whose output pulses at the frequency $f_i$ occur, which are fed through a conductor 26 to a device 27 for generating the above-mentioned input code words and which also, together with pulses from oscillator 13, are fed to an AND-gate 21, at whose outputs a pulse train for the control of buffer 12 occurs. Through an inverter 22 the output of OR-gate 19 is connected to inputs of AND-gates 23 and 24 while output pulses of divider 14 are also fed direct to AND-gate 23 and, through an inverter 25, to AND-gate 24. The output pulses of AND-gate 23, OR-gate 19 and AND-gate 24 are used for the control of the AND-gates 3, 4 and 5 of switching device 2.

It is to be noted that reading out a filter coefficient from ROM 9 can be effected in known manner, for example by considering, at all times, the joint position of dividers 14 and 18 as an address code for the ROM. As is shown diagrammatically in FIG. 1, outputs of dividers 14 and 18, are, for this purpose connected to corresponding inputs of ROM 9. In a manner not further described, a control signal for reading and resetting accumulator 11 can always be derived from this address code at the end of a cycle of calculations.

Figure 2:
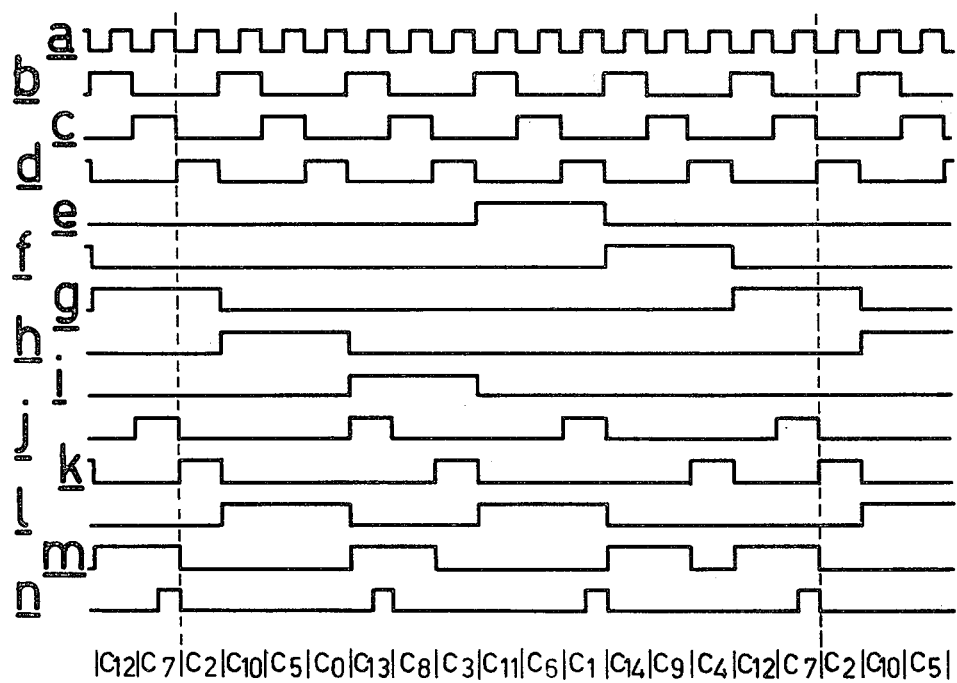
FIG. 2 shows time diagrams illustrating the filter shown in FIG. 1.

In FIG. 2 the operation of the embodiment shown in FIG. 1 is further explained by time diagrams of the pulse generator 7. More particularly, FIG. 2 shows at $a$ a pulse train which is generated by the oscillator 13, the output pulses of divider 14 being indicated at $b$, $c$ and $d$ and the output pulses of divider 18 being indicated at $e, f, g, h$ and $i$. The output signal of OR-gate 20 is shown at $j$. Furthermore, $k$, $l$ and $m$ show the control signals for AND-gates 3, 4 and 5, i.e. the output pulse trains of AND-gate 23, OR-gate 19 and AND-gate 24 respectively, while $n$ shows the control pulses for buffer 12, which are supplied by AND-gate 21.

To explain the operation of the non-recursive interpolating digital filter according to the invention, column A in the below Table indicates the instants at which a new input code word is stored in buffer 12, when $M = 5$ and $L = 3$ and 15 filter coefficients ($N = 15$) are used. Column B indicates the instant at which this code word is written into shift register 8. Columns 8.1, 8.2 and 8.3 show the contents of register sections 8.1, 8.2 and 8.3 and column C shows the filter coefficient by which the code word, stored in section 8.3, is multiplied. Finally, column D shows the output code words.

It is to be noted that the N filter coefficients are numbered from 0 to N−1 and give, in this sequence, the sampled values of the pulse response of the desired filter.

Figure 3:
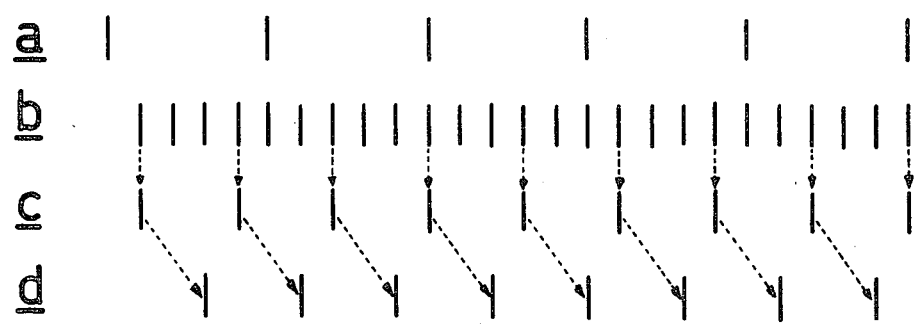
FIG. 3 shows a possible time relation between the input and output code words of the filter according to FIG. 1 and the above-mentioned literature.

FIG. 3 shows a possible time relation between input and output code words. The dotted lines between $c$ and $d$ indicate in which way the output code words of the filter according to the invention may be considered as having been produced by a delay of the code words at $c$, which in their turn are produced by applying a selection procedure to the code words represented at $b$. The code words at $b$ may be considered as having been produced by an interpolation of the input code words at $a$.

Finally it is to be noted that the described non-recursive interpolating digital filter according to the invention can be used in the data transmitter for vestigial side band transmission as described in the copending U.S. patent application Ser. No. 608,392.

We claim:

1. A non-recursive interpolating digital filter comprising:
input means for supplying a sequence of input signals with a predetermined input sampling frequency;
buffer means, connected to said input means for storing an input signal for a variable time;

storage means, connected to said buffer means for storing a predetermined number of successive input signals, and having an output, comprising a shift register having a predetermined number of register sections, the last section in the direction of shifting being connected to said output of said storage means;

multiplying means for multiplying the signals stored in said storage means by weighting factors to produce a product signal;

an adding device, connected to said multiplying means for computing an output signal with a predetermined output sampling frequency, said output signal being the mathematical sum of product signals computed by said multiplying means; and means for controlling the variable storage time of said buffer means so as to supply the input signals to said storage means at instants that are spaced by integral multiples of the period of said output sampling frequency, the ratio between the output sampling frequency and the input sampling being a factor M/L, M and L being integers and M being greater than L.

2. A non-recursive interpolating digital filter comprising:

input means for supplying a sequence of input signals with a predetermined input sampling frequency;

buffer means, connected to said input means for storing an input signal for a variable time;

storage means, connected to said buffer means for storing a predetermined number of successive input signals, and having an output;

multiplying means for multiplying the signals stored in said storage means by weighting factors to produce a product signal;

an adding device, connected to said multiplying means for computing an output signal with a predetermined output sampling frequency, said output signal being the mathematical sum of product signals computed by said multiplying means; and means for controlling the variable storage time of said buffer means so as to supply the input signals to said storage means at instants that are spaced by integral multiples of the period of said output sampling frequency, the ratio between the output sampling frequency and the input sampling being a factor M/L, M and L being integers and M being greater than L, comprising a pulse generator which provides a periodic series of pulses.

3. A non-recursive interpolating digital filter as defined in claim 1, wherein said means for controlling comprises a pulse generator which provides a periodic series of pulses.

4. A non-recursive interpolating digital filter as defined in claim 3, wherein said periodic series of pulses from said pulse generator has a period equal to M periods of said output sampling frequency, each period containing L pulses.

5. A non-recursive interpolating digital filter as defined in claim 4, wherein the length of the interval between each pulse of a series and the beginning of that series being multiplied by L and expressed in a number of periods of said output sampling frequency being equal to or greater than an integral multiple of M, the length of the interval between the next successive pulse in said series and the beginning of that series being multiplied by L and expressed in a number of periods of said output sampling frequency is equal to or greater than the next successive integral multiple of M.

6. A non-recursive interpolating digital filter as defined in claim 2, wherein said storage means comprises a shift register having a predetermined number of register sections, the last section in the direction of shifting being connected to said output of said storage means.

7. A non-recursive interpolating digital filter as defined in claim 2, wherein said periodic series of pulses from said pulse generator has a period equal to M periods of said output sampling frequency, each period containing L pulses.

8. A non-recursive interpolating digital filter as defined in claim 7, wherein the length of the interval between each pulse of a series and the beginning of that series being multiplied by L and expressed in a number of periods of said output sampling frequency being equal to or greater than an integral multiple of M, the length of the interval between the next successive pulse in said series and the beginning of that series being multiplied by L and expressed in a number of periods of said output sampling frequency is equal to or greater than the next successive integral multiple of M.

* * * * *

UNITED STATES PATENT OFFICE
CERTIFICATE OF CORRECTION

Patent No. 3,997,773                Dated December 14, 1976

Inventor(s) Hendrik Arie Van Essen et al.     Page 1 of 2

It is certified that error appears in the above-identified patent and that said Letters Patent are hereby corrected as shown below:

Column 4, after line 61, insert the Table as shown on the attached sheet.

Signed and Sealed this

Twenty-fourth Day of May 1977

[SEAL]

Attest:

RUTH C. MASON
Attesting Officer

C. MARSHALL DANN
Commissioner of Patents and Trademarks

TABLE

| A | B | 8.1 | 8.2 | 8.3 | C | D |
|---|---|---|---|---|---|---|
| x(n) ----→ | | x(n) | x(n-1) | x(n-2) | c(10) | |
| | | x(n-1) | x(n) | x(n-1) | c(5) | |
| | | x(n-2) | x(n-1) | x(n) | c(0) | y(k)=c(10).x(n-2)+c(5).x(n-1)+c(0).x(n) |
| | | x(n) | x(n-1) | x(n-2) | c(13) | |
| | | x(n+1) | x(n) | x(n-1) | c(8) | |
| x(n+1) ⌐---→ | | x(n-1) | x(n+1) | x(n-1) | c(3) | y(k+1)=c(13).x(n-2)+c(8).x(n-1)+c(3).x(n) |
| ↓ | | x(n+1) | x(n) | x(n-1) | c(11) | |
| | | x(n) | x(n+1) | x(n) | x(6) | |
| | | x(n-1) | x(n-1) | x(n+1) | c(1) | y(k+2)=c(11).x(n-1)+c(6).x(n)+c(1).x(n+1) |
| x(n+2) | | x(n+1) | x(n+1) | x(n+1) | c(14) | |
| ↓ | | x(n+1) | x(n) | x(n+1) | c(9) | |
| | | x(n+2) | x(n+1) | x(n+1) | c(4) | y(k+3)=c(14).x(n-1)+c(9).x(n)+c(4).x(n+1) |
| | | x(n+1) | x(n+2) | x(n+1) | c(7) | |
| | | x(n+2) | x(n+1) | x(n) | c(12) | |
| x(n+3) ----→ | | x(n+2) | x(n+1) | x(n+1) | c(7) | y(k+4)=c(12).x(n)+c(7).x(n+1)+c(2).x(n+2) |
| | | x(n+3) | x(n+2) | x(n+1) | c(2) | |
| | | x(n+2) | x(n+2) | x(n+2) | c(10) | |
| | | x(n+1) | x(n+1) | x(n+3) | c(5) | |
| | | x(n+3) | x(n+3) | x(n+3) | c(0) | y(k+5)=c(10).x(n+1)+c(5).x(n+2)+c(0).x(n+3) |
| | | x(n+2) | x(n+3) | x(n+2) | c(8) | |
| | | x(n+3) | x(n+2) | x(n+3) | c(13) | |
| x(n+4) ⌐---→ | | x(n+3) | x(n+3) | x(n+3) | c(3) | y(k+6)=c(13).x(n+1)+c(8).x(n+2)+c(3).x(n+3) |
| ↓ | | x(n+2) | x(n+4) | x(n+3) | c(11) | |
| | | x(n+3) | x(n+3) | x(n+2) | c(6) | |
| | | x(n+3) | x(n+4) | x(n+4) | c(1) | y(k+7)=c(11).x(n+2)+c(6).x(n+3)+c(1).x(n+4) |